United States Patent [19]
Hayase et al.

[11] Patent Number: 4,479,860
[45] Date of Patent: Oct. 30, 1984

[54] PHOTO-CURABLE EPOXY RESIN COMPOSITION

[75] Inventors: Shuzi Hayase, Kawasaki; Yasunobu Onishi, Yokohama, both of Japan

[73] Assignee: Tokyo Shibaura Denki Kabushiki Kaisha, Kawasaki, Japan

[21] Appl. No.: 531,316

[22] Filed: Sep. 12, 1983

[30] Foreign Application Priority Data

Sep. 14, 1982 [JP] Japan .................. 57-158889

[51] Int. Cl.$^3$ .................. C08G 59/68; C08G 59/70
[52] U.S. Cl. .................. 204/159.11; 528/92; 528/361; 528/368; 528/416; 525/506
[58] Field of Search .................. 204/159.11; 528/92, 528/361, 368, 416; 525/506

[56] References Cited

U.S. PATENT DOCUMENTS

| | | | |
|---|---|---|---|
| 3,708,296 | 1/1973 | Schlesinger | 96/33 |
| 4,081,276 | 3/1978 | Crivello | 96/35.1 |
| 4,322,513 | 3/1982 | Wada et al. | 528/92 X |
| 4,324,873 | 4/1982 | Wada et al. | 525/507 |
| 4,406,764 | 9/1983 | Hayase et al. | 204/159.11 |
| 4,437,959 | 3/1984 | Hayase et al. | 528/92 X |

OTHER PUBLICATIONS

R. L. Dennley et al., "The Decomposition of Silyl Hydroperoxides", Journal of Organic Chemistry, vol. 30, p. 3848, 1965.
European Search Report.

Primary Examiner—Earl A. Nielsen
Attorney, Agent, or Firm—Schwartz, Jeffery, Schwaab, Mack, Blumenthal & Koch

[57] ABSTRACT

There is disclosed a photo-curable epoxy resin composition comprising an epoxy resin and a combination of an aluminum compound and a silicon compound having a peroxysilyl group as a hardening catalyst.

The compositions of the present invention can suitably be used for wide varieties of electrical applications.

8 Claims, No Drawings

PHOTO-CURABLE EPOXY RESIN COMPOSITION

This invention relates to a novel photo-curable epoxy resin composition, and more particularly to a photo-curable epoxy resin composition which has been improved in curing characteristics and which provides a cured product having suitable electric characteristics for use as insulating and resist material in electric equipment.

Recently, a process for hardening a resin by use of a light is attracted attention to save energy and improve operating efficiency in the field of resins. Among others, processes for photo-curable the epoxy resins are regarded as important because of wide range of their possible applications. In a process for photo-curing an epoxy resin, the epoxy resin itself is very important, besides the curing conditions. Thus, compositions having various formulations have been studied. The photo-curable epoxy resin compositions, which have hitherto been known to the art, can roughly be classified into two groups.

One is an epoxy resin which has been modified by using a photo-polymerizable compound containing a double bond or bonds, such as acrylic acid and its derivatives. As such modified epoxy resin, there may be mentioned, for example,

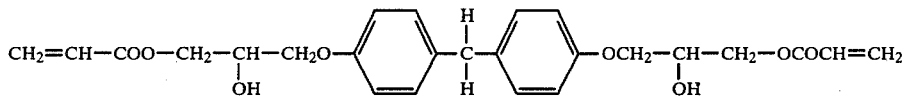

[see Japanese Provisional Patent Publication No. 11920/1981].

The other is an epoxy resin containing a photo-decomposable catalyst and is to be cured by the catalyst. As the photo-decomposable catalyst used for the purpose, there may be mentioned the complex having the following formula:

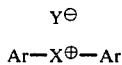

wherein Ar represents a phenyl group; X represents an iodine atom, a sulfur atom or a diazo group; and Y represents $BF_4$, $PF_6$, $AsF_6$ or $SbF_6$.

[see, for example, Macromolecules, Vol. 10, 1307 (1977); Journal of Radiation Curing, Vol. 5, 2 (1978); Journal of Polymer Science Polymer Chemistry Edition, Vol. 17, 2877 (1979); Ibid. Vol. 17, 1047 (1979); Journal of Polymer Science Polymer Letters Edition, Vol. 17, 759 (1979); Japanese Provisional Patent Publication No. 65219/1980; U.S. Pat. No. 4,069,054; and British Pat. No. 1,516,511 and No. 1,518,141.]

However, photo-cured products obtained from the former type, i.e. modified epoxy type resins, have the defects that heat resistance is considerably inferior to that of photo-cured products obtained from epoxy resins themselves.

On the other hand, in case of the latter type, i.e. the epoxy resin compositions containing the photo-decomposable catalysts, obtained photo-cured products show good mechanical and thermal characteristics. In this case, however, the catalyst components remain as ionic impurities in the photo-cured products so that when such photo-cured products containing the ionic impurities are used in electric equipment, the ionic impurities adversely affect the electric characteristics of the photo-cured products such as an electric insulation ability and sometimes cause an electric equipment or the like to corrode.

An object of this invention is to provide a photo-curable epoxy resin composition which has good photo-curability and gives a cured product having excellent mechanical and thermal characteristics and containing no ionic impurities, thereby eliminating the disadvantages of the conventional photo-curable epoxy resin compositions described above.

The photo-curable epoxy resin composition according to this invention comprises an epoxy resin and a combination of an aluminum compound and a silicon compound having a peroxysilyl group as a photo-decomposable catalyst.

The composition according to this invention will be described more detail in the following.

The epoxy resins which may be used in accordance with the present invention contain any epoxy resins as long as they are used as a epoxy resin composition, generally. Examples of epoxy resins are bisphenol A type epoxy resins, bisphenol F type epoxy resins, phenol-novolac type epoxy resins, alicyclic epoxy resins, heterocyclic ring-containing epoxy resins such as triglycidyl isocyanurate and hydantoin epoxy, hydrogenated bisphenol A type epoxy resins, aliphatic epoxy resins such as propylene glycol diglycidyl ether and pentaerythrytol polyglycidyl ethers, glycidyl ester type epoxy resins obtained by the reaction of an aromatic, aliphatic or cycloaliphatic carboxylic acid with epichlorohydrin, spiro ring containing epoxy resins, glycidyl ether type epoxy resins obtained by the reaction of an ortho-allylphenol novolak compound with epichlorohydrin, glycidyl ether type epoxy resins obtained by the reaction of epichlorohydrin with a diallyl bisphenol compound having an allyl group at the ortho-position with respect to each hydroxyl group of bisphenol A, and the like.

The aluminum compounds used as one component of the photo-decomposable catalysts according to this invention are the compounds having an organic group selected from the group consisting of an alkyl group, a phenyl group, a haloalkyl group, an alkoxy group, a phenoxy group, an acyloxy group, a β-diketonato group and an o-carbonylphenolato group.

In the above-mentioned organic groups, as the alkoxy group, there may be mentioned, for example, a methoxy group, and ethoxy group, an isopropoxy group, a butoxy group and a pentoxy group; as the phenoxy group, there may be mentioned, for example, a phenoxy group, an o-methylphenoxy group, an o-methoxy-phenoxy group, a p-nitrophenoxy group and a 2,6-dimethylphenoxy group; as the acyloxy group, there may be mentioned, for example, each group of an acetato, a propionato, an isopropionato, a butyrato, a stearato, an ethylacetoacetato, a propylacetoacetato, a butylacetoacetato, a diethylaceteacetato, a diethylmalonato and a dipivaloylmethanato; as the β- diketonato group, there may be exemplified, each group of an acetylacetonato, a trifluoroacetylacetonato, a hexafluoroacetylacetonato,

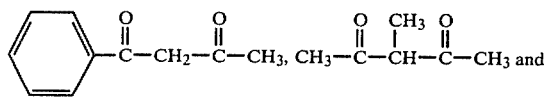

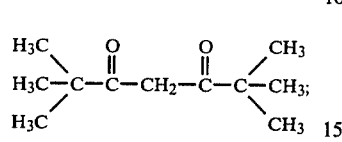

and as the o-carbonylphenolato group, there may be mentioned, for example, a salicylaldehydato group.

Examples of the aluminum compounds are trismethoxyaluminum, trisethoxyaluminum, trisisopropoxyaluminum, trisphenoxyaluminum, tris(p-methylphenoxy)aluminum, isopropoxydiethoxyaluminum, trisbutoxyaluminum, trisacetoxyaluminum, aluminum trisstearate, aluminum trisbutyrate, aluminum trispropionate, aluminum trisisopropionate, trisacetylacetonatoaluminum, tris(trifluoroacetylacetonato)aluminum, tris(hexafluoroacetylacetonato)aluminum, aluminum trisethylacetoacetate, aluminum trissalicylaldehyde, aluminum tris(diethylmalonate), aluminum trispropylacetoacetate, aluminum trisbutylacetoacetate, tris(dipivaloylmethanato)aluminum, diacetylacetonatodipivaloylmethanatoaluminum,

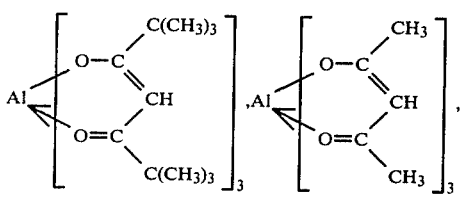

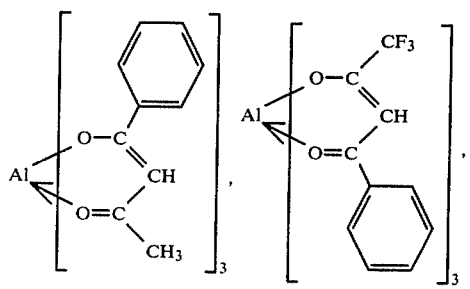

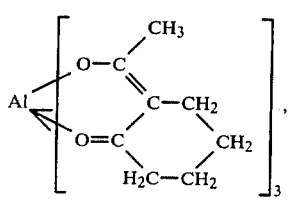

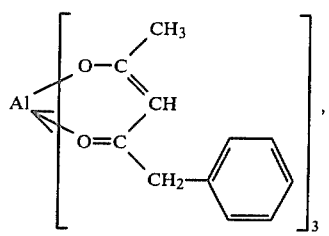

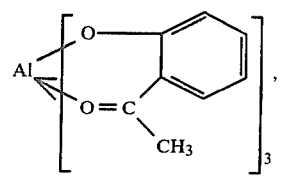

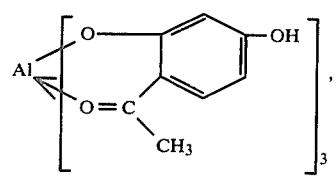

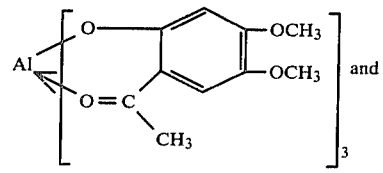 and

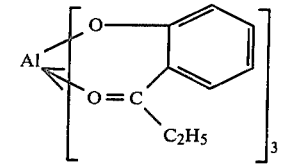

These aluminum compounds may be used independently or in admixture with one another. They are generally used in an amount of 0.001 to 10% by weight, preferably 0.1 to 5% by weight based on the epoxy resins. An amount of the aluminum compounds below 0.001% by weight cannot give sufficient curing characteristics, on the other hand, an amount thereof in excess of 10% by weight would make cost of the compositions expensive and cause the electric characteristics to deteriorate.

The silicon compounds having a peroxysilyl group used as another component of the photo-decomposable catalysts in accordance with the present invention are the compounds having the following formula:

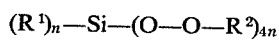

in which $R^1$ represents a hydrogen atom, an alkyl group having from 1 to 5 carbon atoms, an alkoxy group having from 1 to 5 carbon atoms or an aryl group; $R^2$ represents a hydrogen atom, an alkyl group having from 1 to 10 carbon atoms or an aralkyl group; and n represents an integer from 0 to 3.

In the above formula, the alkyl group of $R^1$ having from 1 to 5 carbon atoms may, for example, be a methyl group, an ethyl group, an isopropyl group, an n-propyl group, an n-butyl group, a tert-butyl group, an sec-butyl group, an n-pentyl group, and the like. The alkoxy group having from 1 to 5 carbon atoms may, for example, be a methoxy group, an ethoxy group, an isopropoxy group, an n-butoxy group, an n-pentyloxy group, and the like. The aryl group may, for example, a phenyl group, a naphthyl group, an anthranyl group, a benzyl group, and the like. The alkyl group of $R^2$ having from 1 to 10 carbon atoms may, for example, be a methyl group, an ethyl group, an isopropyl group, an n-propyl group, an n-butyl group, a tert-butyl group, a sec-butyl group, an n-pentyl group, a hexyl group, a heptyl group, an octyl group, a nonyl group, a decyl group, and the like. The aralkyl group may, for example, be a benzyl group, a phenyl ethyl group, an α-phenylethyl group, an α-phenylisopropyl group, a methyl benzyl group, and the like. These alkyl group having from 1 to 5 carbon atoms, alkoxy group having from 1 to 5 carbon atoms, aryl group, alkyl group having from 1 to 10 carbon atoms and aralkyl group may be substituted with an halogen atom, a nitro group, a cyano group, a methoxy group or the like.

Examples of the silicon compounds having a peroxysilyl group, there may be exemplified the following compounds:

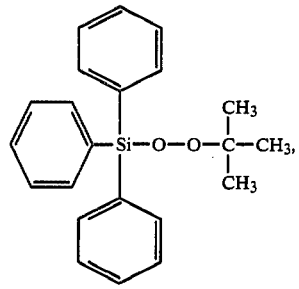

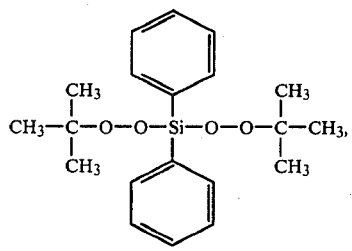

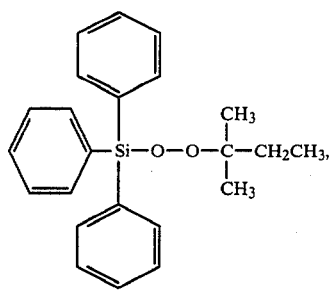

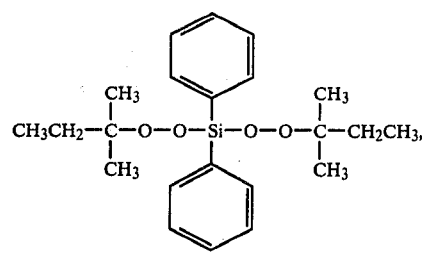

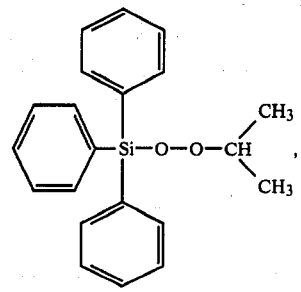

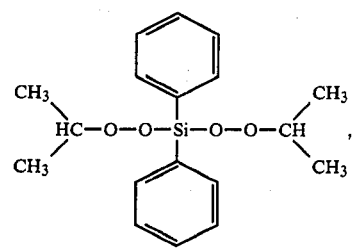

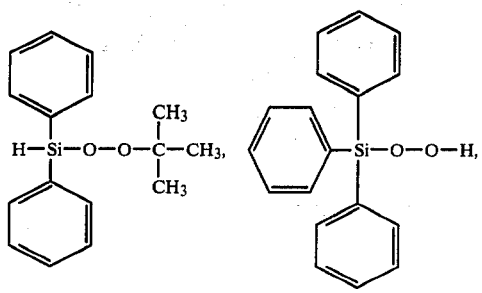

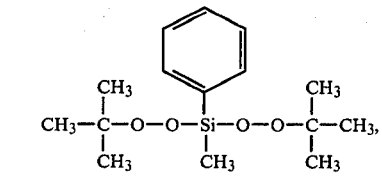

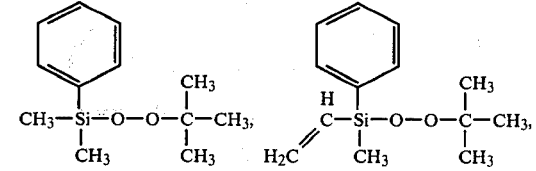

-continued

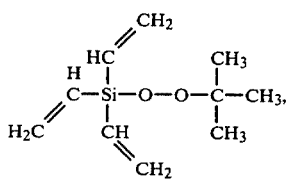

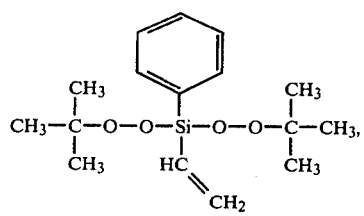

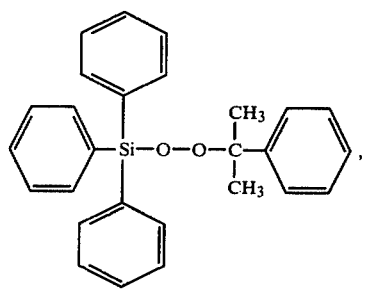

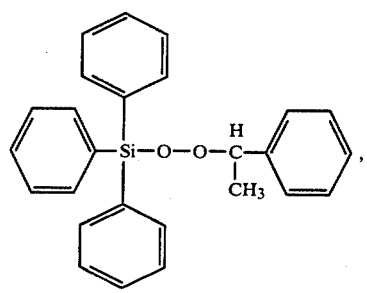

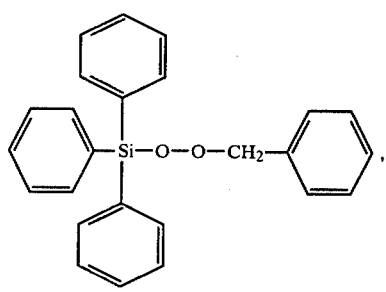

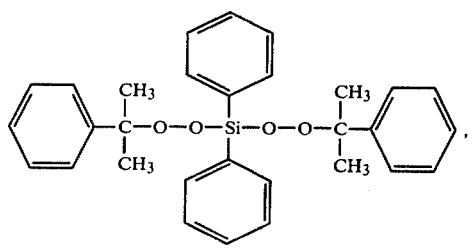

-continued

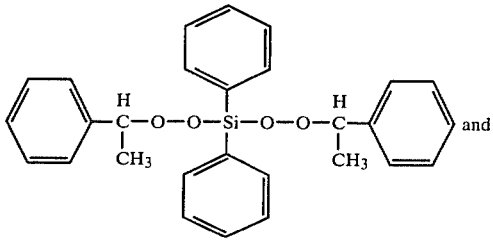 and

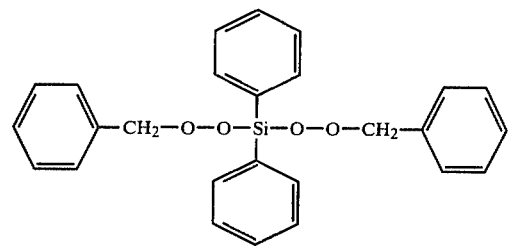.

These silicon compounds are generally used in an amount of 0.1 to 20% by weight, preferably 1 to 10% by weight, based on the epoxy resin. An amount of the silicon compound below 0.1% by weight cannot give sufficient curing characteristics, on the contrary an amount thereof in excess of 20% by weight can also be used, but would make the compositions expensive and would present a problem concerning decomposition products of the catalyst components.

The photo-curable compositions of the present invention can be cured by method such as room-temperature photo-curing, high-temperature photo-curing, after-cure which is effected after the photo-curing, etc. The wavelength of light necessary for the photo-curing will generally be from 180 nm to 600 nm, preferably from 200 nm to 400 nm; the irradiation time will generally be from 10 sec. to 180 min., preferably from 1 min. to 60 min., depending on the epoxy resin composition and the catalyst to be used; and the temperature in case of high-temperature photo-curing will generally be from 20° C. to 200° C., preferably from 60° C. to 100° C., depending on the epoxy resin composition and the catalyst to be used. As the light source to be used in this invention, any kind of light source may be available, so long as it is ordinarily used for photo-curing, including a high-pressure mercury-vapor lamp, a carbon arc lamp, a xenon lamp, an argon glow discharge tube and the like. In case of after-cure which is effected after the photo-curing will generally be carried out at 50° C. to 200° C., preferably at 100° C. to 180° C., and effected for 1 to 10 hrs., preferably for 2 to 5 hrs., depending on the epoxy resin composition and the catalyst to be used.

The obtained cured product shows extremely excellent electric characteristics.

This invention will further be illustrated below in accordance with the following nonlimitative examples.

EXAMPLE 1

10 g of ERL 4221 [trade name, available from UCC Co. Ltd.; the compound having following formula (1), epoxy equivalent: 130, molecular weight: 260], 0.3 g of tris(propylacetoacetato)aluminum and 0.5 g of tert-butylperoxytriphenylsilane were put into a quartz tube for polymerization. When the mixture was exposed at 40° C. to light emitted from a high-pressure mercury-vapor lamp (400W) according to the merry-go-round type photoirradiation device at a distance from 20 cm for 10 seconds, the reaction system had already been gelled. On the other hand, when the mixture was not exposed to a light, gelation did not occur.

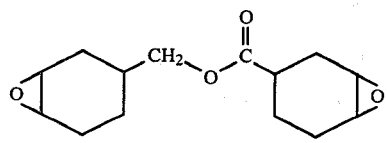
(1)

EXAMPLE 2

10 g of Chisso Nox 206 [trade name, available from Chisso Corporation, Japan; the compound having following formula (2), epoxy equivalent: 70, molecular weight: 139], 4 g of Epikote 828 [trade name, available from Shell Kagaku K. K., Japan; bisphenol A type epoxy resin, epoxy equivalent: 190-210, molecular weight: 380], 0.5 g of tris(ethylacetoacetato) aluminum and 0.5 g of di(tert-butylperoxy)diphenylsilane were put into a quartz tube for polymerization. When the mixture was exposed to light for 10 minutes in the same manner as in Example 1, the reaction system had already been gelled.

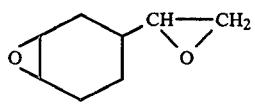
(2)

EXAMPLE 3

A mixture was prepared from 100 g of ERL 4221, 30 g of Epikote 154 [trade name, available from Shell Kagaku K. K., Japan; phenol novolac type epoxy resin, epoxy equivalent: 172-180], 30 g of Epikote 828, 3 g of tris(salicylaldehydato) aluminum and 4 g of tert-butylperoxytriphenylsilane. The mixture was applied onto an aluminum plate. When exposed to an ultra-violet ray emitted from a mercury lamp (400 W) for 1 minute, there was yielded a satisfactory cured resin plate. Measurement of the electric characteristics at 100° C. of the cured resin plate indicated that a dielectric loss tangent value (tan δ) thereof was 4.0% at 100° C. The cured film passed the cross-cut test which was a test for adhesion characteristics.

The cured resin plate was then after-cured at 130° C. for 5 hours and the tan δ value thereof was measured again to be 5.0% at 180° C.

EXAMPLE 4

A mixture was prepared from 100 g of ERL 4221, 50 g of Epikote 152 (Trade Name, available from Shell Kagaku K. K., Japan; phenol novolac type epoxy resin, epoxy equivalent: 172-179), 20 g of bisphenol F, 5 g of tris(ethylacetoacetato)aluminum and 6 g of tert-butylperoxytriphenylsilane. The thus obtained mixture was exposed to a light for 1 minute in the same manner as in Example 3 to obtain a cured resin plate. The cured resin plate was then after-cured at 150° C. for 5 hours. Measurement of the electric characteristics of the obtained resin plate indicated that the tan δ value thereof was 6.5% at 180° C.

COMPARATIVE EXAMPLE 1

A mixture was prepared from 10 g of ERL 4221 and tert-butylperoxysilane. The mixture was treated in the same manner as in Example 1, whereupon no polymer was obtained.

COMPARATIVE EXAMPLE 2

A mixture was prepared from 100 g of ERL 4221, 30 g of Epikote 154, 30 g of Epikote 828 and 0.3 g of diphenyliodonium tetrafluoroboric acid salt. The mixture was treated in the same manner as in Example 3. The tan δ value of this after-cured resin plate could not be measured at 180° C.

EXAMPLE 5

5 g of ERL 4234 [trade name, available from UCC Co. Ltd.; the compound having following formula (3), epoxy equivalent: 133-154], 5 g of ERL 4299 [trade name, available from UCC Co. Ltd.; the compound having following formula (4), epoxy equivalent: 190-210], 0.3 g of tris(isobutylacetoacetato)aluminum and 0.3 g of cumylperoxytriphenylsilane were mixed and homogeneously dissolved with each other. When the mixture was applied onto a cupper plate at a thickness of 10μ and exposed to a mercury lamp of 80 W/cm² at a distance from 15 cm, there was obtained a cured resin plate after 30 seconds. Measurement of the electric characteristics of the obtained resin plate indicated that a tan δ value thereof was 1.0% at 180° C.

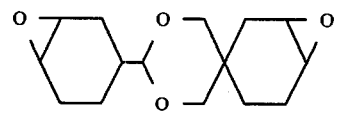
(3)

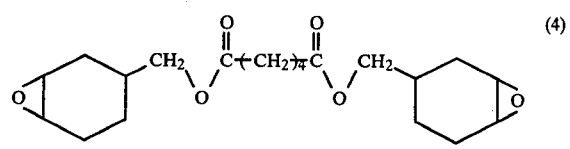
(4)

EXAMPLE 6

90 g of ERL 4299, 10 g of Epikote 1004, 2 g of tris-(isobutylacetoacetato)aluminum and 5 g of triphenyl-tert-butylperoxysilane were mixed and homogeneously dissolved with each other. The thus obtained mixture was cured in the same manner as in Example 5. This cured product was then boiled in water at 100° C. for 15 hours, but neither deterioration of the adhesion strength thereof to the cupper plate nor corrosion of the cupper plate were observed.

COMPARATIVE EXAMPLE 3

A mixture was prepared in the same manner as in Example 6 except that the triphenyl-tert-butylperoxysilane was not added. The mixture was treated in the same manner as in Example 6, whereupon no polymer was obtained.

As is clear from the above results, the compositions of the present invention quickly harden when exposed to light and give cured products which show extremely excellent electric insulating characteristics.

The photo-curable epoxy resin compositions of the present invention harden in short time when exposed to light due to the use of an aluminum compound and a silicon compound having a peroxysilyl group as catalyst components. Moreover, the obtained cured product is extremely excellent in the electric characteristics such as a tan δ value since it contains no ionic impurities, and thereby does not cause the corrosion of an electric appliance when the product is used in the electric appliance. Therefore, the cured product can be used for wide variations of applications such as resist materials and insulating materials for electric appliances, particularly for coils. It should thus be concluded that the industrial value of the photo-curable epoxy resin is extremely great.

We claim:

1. A photo-curable epoxy resin composition which comprises an epoxy resin and a combination of an aluminum compound and a silicon compound having a peroxysilyl group as a hardening catalyst.

2. A photo-curable epoxy resin composition according to claim 1, wherein said aluminum compound is an organic aluminum compound.

3. A photo-curable epoxy resin composition according to claim 2, wherein said organic aluminum compound is selected from the group consisting of an alkoxy aluminum compound, an aryloxy aluminum compound, an acyloxy aluminum compound and an aluminum chelate compound.

4. A photo-curable epoxy resin composition according to claim 1, wherein said aluminum compounds is used in an amount of 0.001 to 10% by weight based on the epoxy resin.

5. A photo-curable epoxy resin composition according to claim 4, wherein said aluminum compounds is used in an amount of 0.1 to 5% by weight based on the epoxy resin.

6. A photo-curable epoxy resin composition according to claim 1, wherein said silicon compound having a peroxysilyl group has the following general formula:

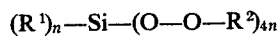

in which $R^1$ represents a hydrogen atom, an alkyl group having from 1 to 5 carbon atoms, an alkoxy group having from 1 to 5 carbon atoms or an aryl group; $R^2$ represents a hydrogen atom, an alkyl group having from 1 to 10 carbon atoms or an aralkyl group; and n represents an integer from 0 to 3.

7. A photo-curable epoxy resin composition according to claim 1, wherein said silicon compound having a peroxysilyl group is used in an amount of 0.1 to 20% by weight based on the epoxy resin.

8. A photo-curable epoxy resin composition according to claim 7, wherein said silicon compound having a peroxysilyl group is used in an amount of 1 to 10% by weight based on the epoxy resin.

* * * * *